(12) United States Patent
Lu et al.

(10) Patent No.: US 10,404,036 B1
(45) Date of Patent: Sep. 3, 2019

(54) TWO-DIMENSIONAL PHOTONIC CRYSTAL SURFACE-EMITTING LASER WITH TRANSPARENT CONDUCTIVE CLADDING LAYER

(71) Applicant: National Chiao Tung University, Hsinchu (TW)

(72) Inventors: Tien-Chang Lu, Zhubei (TW); Kuo-Bin Hong, Hsinchu (TW); Shen-Che Huang, Taoyuan (TW)

(73) Assignee: NATIONAL CHIAO TUNG UNIVERSITY, Hsinchu (TW)

( * ) Notice: Subject to any disclaimer, the term of this patent is extended or adjusted under 35 U.S.C. 154(b) by 0 days.

(21) Appl. No.: 16/149,861

(22) Filed: Oct. 2, 2018

(30) Foreign Application Priority Data

Feb. 13, 2018 (TW) .............................. 107105249 A (51) Int. Cl.
*H01S 5/00* (2006.01)
*H01S 5/10* (2006.01)
(Continued)

(52) U.S. Cl.
CPC ............ *H01S 5/105* (2013.01); *H01S 5/0212* (2013.01); *H01S 5/0425* (2013.01); *H01S 5/18* (2013.01); *H01S 5/2059* (2013.01); *H01S 5/2205* (2013.01); *H01S 5/2206* (2013.01); *H01S 5/2222* (2013.01); *H01S 5/3215* (2013.01); *H01S 5/343* (2013.01); *H01S 5/18308* (2013.01); *H01S 5/2018* (2013.01); *H01S 5/34* (2013.01)

(58) Field of Classification Search
CPC .......... H01S 5/105; H01S 5/0425; H01S 5/18; H01S 5/2059; H01S 5/2206; H01S 5/2222; H01S 5/343; H01S 5/34; H01S 5/18308; H01S 5/2018; H01S 5/2205; H01S 5/0212; H01S 5/3215
See application file for complete search history.

(56) References Cited

U.S. PATENT DOCUMENTS

| 6,674,778 B1 * | 1/2004 | Lin | .................. B82Y 20/00 372/46.01 |
| 2003/0043870 A1 * | 3/2003 | Shchukin | ............... B82Y 10/00 372/45.01 |

(Continued)

*Primary Examiner* — Kinam Park
(74) *Attorney, Agent, or Firm* — Muncy, Geissler, Olds & Lowe, P.C.

(57) ABSTRACT

A two-dimensional photonic crystal laser with transparent conductive cladding layer is provided. The two-dimensional photonic crystal region through the etching process is composed by multiple periodic air-holes with proper duty cycle. Then, the transparent conductive oxide layer is directly deposited on the top of the entire two-dimensional photonic crystal structure to cover the entire two-dimensional photonic crystal structure in order to form a current spreading layer. The configuration and the process condition of transparent conductive oxide layer are optimized to provide uniform current spreading path and the transparency. In addition to simplifying the whole fabrication process, the optical confinement is improved and the maximum gain to optical feedback is obtained. Overall, low threshold, small divergence angle and high quality laser output is achieved to satisfy the requirements for next-generation light sources.

10 Claims, 7 Drawing Sheets

(51) Int. Cl.
    *H01S 5/18*     (2006.01)
    *H01S 5/22*     (2006.01)
    *H01S 5/20*     (2006.01)
    *H01S 5/042*     (2006.01)
    *H01S 5/343*     (2006.01)
    *H01S 5/02*     (2006.01)
    *H01S 5/32*     (2006.01)
    H01S 5/34     (2006.01)
    H01S 5/183     (2006.01)

(56) References Cited

U.S. PATENT DOCUMENTS

2005/0152424 A1*   7/2005   Khalfin ............... H01S 5/20
                                                    372/64
2006/0171440 A1*   8/2006   Ledentsov ........... G02B 5/26
                                                    372/99
2006/0220031 A1*   10/2006   Krames ............... H01L 33/30
                                                    257/79
2017/0047481 A1*   2/2017   Bonar ............... H01L 33/0095

* cited by examiner

TWO-DIMENSIONAL PHOTONIC CRYSTAL SURFACE-EMITTING LASER WITH TRANSPARENT CONDUCTIVE CLADDING LAYER

CROSS-REFERENCE TO RELATED APPLICATION

This application claims the benefit of Taiwan Patent Application No. 107105249, filed on Feb. 13, 2018, in the Taiwan Intellectual Property Office, the disclosure of which is incorporated herein in its entirety by reference.

BACKGROUND OF THE INVENTION

1. Field of the Invention

The present invention generally relates to a surface-emitting laser, more particularly to a two-dimensional photonic crystal surface-emitting laser with a transparent conductive cladding layer.

2. Description of the Related Art

With the advancement of science and technology, lasers have become more and more popular and suitable for use in medical purposes, optical communications, and industrial processing. However, conventional laser development techniques have onerous burden and complex procedure during fabrication. Technological hurdles include slow deposition rates, requirement of an ultra-clean surface with ultra-low roughness, ions damage of the semiconductor materials, and difficulties in controlling the precise impurity profile. For this reason, an alternative approach to simplify the fabrication process in necessary.

Therefore, a solution is needed which develops a two-dimensional photonic crystal surface-emitting laser with transparent conductive cladding layer to improve upon the above-mentioned problem.

SUMMARY OF THE INVENTION

In order to solve the aforementioned conventional problem, the present invention provides a two-dimensional photonic crystal surface-emitting laser with a transparent conductive cladding layer.

According to an embodiment, the present invention provides a two-dimensional photonic crystal surface-emitting laser with transparent conductive cladding layer comprises a substrate, a N-type graded-refractive layer, a N-type cladding layer, a N-type optical confinement layer, a emission layer, a P-type optical confinement layer, a photonic crystal region, a current confinement structure and a transparent conductive layer. Disposed upon the substrate is the N-type graded-refractive layer. Disposed upon the N-type graded-refractive layer is the N-type cladding layer. The N-type optical confinement layer is then disposed on the N-type cladding layer. Disposed on the N-type optical confinement layer is the emission layer. The P-type optical confinement layer is then disposed on the emission layer. Disposed upon the P-type confinement layer is the photonic crystal region. The photonic crystal region is comprised of a P-type injection layer and a plurality of periodic holes formed in the P-type injection layer which are arranged in interval. There is an area duty ratio between each periodic hole. The current confinement structure surrounds the photonic crystal region. The transparent conductive layer is disposed on the current confinement structure and covers the photonic crystal region.

Preferably, the photonic crystal region is a two-dimensional periodic structure.

Preferably, the P-type injection layer comprises a P-type cladding layer, a P-type graded-refractive layer, and a P-type heavily-doped capping layer. The P-type cladding layer is disposed on the P-type optical confinement layer, the P-type graded-refractive layer is disposed on the P-type cladding layer, the P-type heavily-doped capping layer is disposed on the P-type graded-refractive layer.

Preferably, the width of each periodic hole and the duty cycle of the area duty ratio is in a range from 100 nm to 1000 nm.

Preferably, the cross-sectional shape of each periodic hole is a circular shape, a quadrangular shape or a hexagonal shape.

Preferably, the emission layer is a multiple-quantum-well structure.

Preferably, the two-dimensional photonic crystal surface-emitting laser with transparent conductive cladding layer further comprises a P-type metal electrode and a back electrode. The P-type metal electrode is disposed to surround the photonic crystal region and deposited on the transparent conductive layer. The back electrode is disposed under the substrate.

Preferably, a size of the current confinement structure is in a range from 1 μm to 1000 μM.

Preferably, the material of the current confinement structure is an insulation material.

Preferably, the material of the transparent conductive layer comprises ITO, ZnO, AlGaInSnO, AZO, $SnO_2$, $In_2O_3$, SnZnO, or graphene.

According to above contents, the two-dimensional photonic crystal surface-emitting laser with transparent conductive cladding layer of the present invention can have one or more of the following advantages.

First, in the two-dimensional photonic crystal surface-emitting laser with transparent conductive cladding layer of the present invention, with configuration of the current confinement structure and the transparent conductive layer, current can spread uniformly and the light emitting area is confined, so that the light produced by the emission layer can resonate in the photonic crystal region to produce a laser beam.

Secondly, in the two-dimensional photonic crystal surface-emitting laser with transparent conductive cladding layer of the present invention, the photonic crystal region with the two-dimensional periodic structure can be served as the resonator, preventing mode competition.

BRIEF DESCRIPTION OF THE DRAWINGS

The structure, operating principle and effects of the present invention will be described in detail by way of various embodiments, which are illustrated in the accompanying drawings.

DETAILED DESCRIPTION OF THE PREFERRED EMBODIMENTS

The following embodiments of the present invention are herein described in detail with reference to the accompanying drawings. These drawings show specific examples of the embodiments of the present invention. It is to be understood that these embodiments are exemplary implementations and are not to be construed as limiting the scope of the present invention in any way. Further modifications to the disclosed embodiments, as well as other embodiments, are also included within the scope of the appended claims. These embodiments are provided so that this disclosure is thorough and complete, and fully conveys the inventive concept to those skilled in the art. Regarding the drawings, the relative proportions and ratios of elements in the drawings may be exaggerated or diminished in size for the sake of clarity and convenience. Such arbitrary proportions are only illustrative and not limiting in any way. The same reference numbers are used in the drawings and description to refer to the same or like parts.

It is to be understood that, although the terms 'first', 'second', 'third', and so on, may be used herein to describe various elements, these elements should not be limited by these terms. These terms are used only for the purpose of distinguishing one component from another component. Thus, a first element discussed herein could be termed a second element without altering the description of the present disclosure. As used herein, the term "or" includes any and all combinations of one or more of the associated listed items.

It will be understood that when an element or layer is referred to as being "on," "connected to" or "coupled to" another element or layer, it can be directly on, connected or coupled to the other element or layer, or intervening elements or layers may be present. In contrast, when an element is referred to as being "directly on," "directly connected to" or "directly coupled to" another element or layer, there are no intervening elements or layers present.

In addition, unless explicitly described to the contrary, the word "comprise" and variations such as "comprises" or "comprising", will be understood to imply the inclusion of stated elements but not the exclusion of any other elements.

Figure 1:
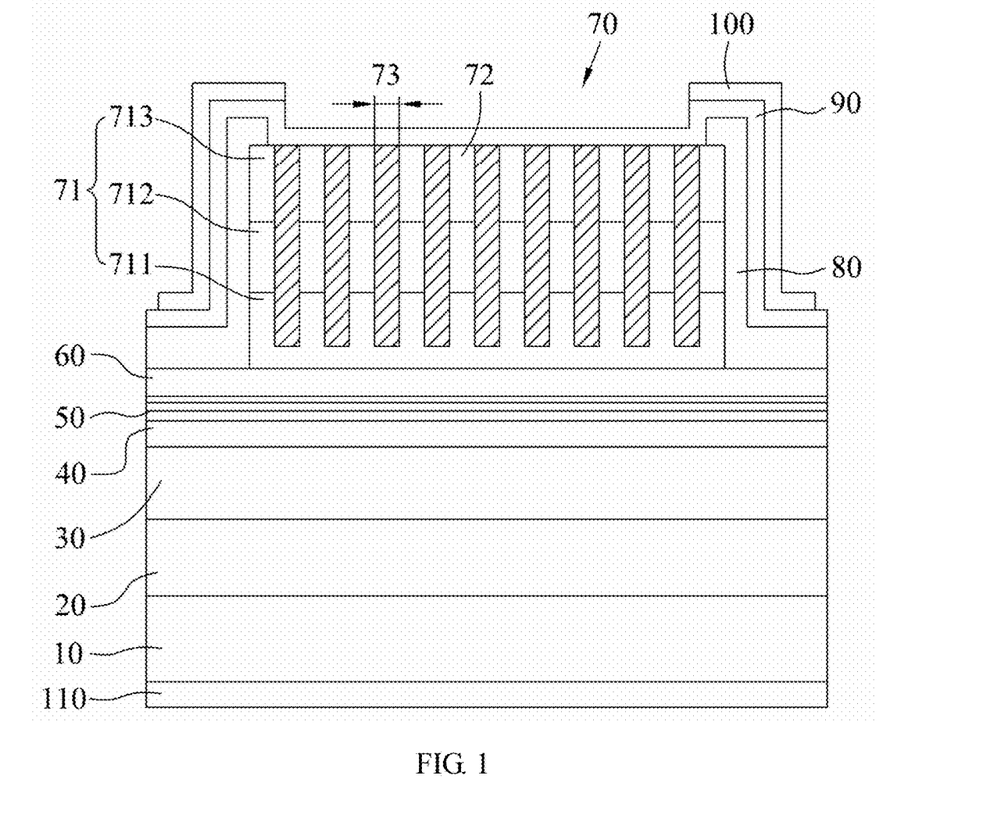
FIG. 1 is an epitaxial structural view of a two-dimensional photonic crystal surface-emitting laser with transparent conductive cladding layer of a first embodiment of the present invention.
Figure 2:
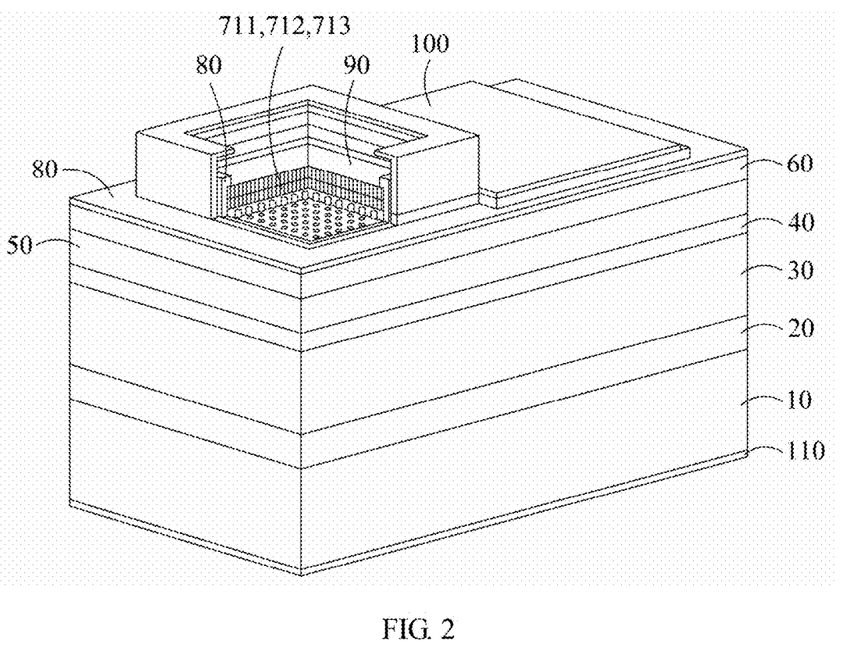
FIG. 2 is a three-dimensional perspective structural view of a two-dimensional photonic crystal surface-emitting laser with transparent conductive cladding layer of a first embodiment of the present invention.

Please refer to FIGS. 1 and 2, which are epitaxial structural view and three dimensional perspective structural view of a two-dimensional photonic crystal surface-emitting laser with transparent conductive cladding layer of a first embodiment of the present invention. In this embodiment, a two-dimensional photonic crystal surface-emitting laser comprises a substrate 10, a N-type graded-refractive layer 20, a N-type cladding layer 30, a N-type optical confinement layer 40, an emission layer 50, a P-type optical confinement layer 60, a photonic crystal region 70, a current confinement structure 80 and a transparent conductive layer 90. Each layer is stacked from bottom to top in sequential order beginning with the substrate 10 and continuing to the transparent conductive layer 90. The emission layer 50 is a multiple-quantum-well structure. The photonic crystal region 70 is a two-dimensional periodic structure, and comprises a P-type injection layer 71 and a plurality of periodic holes 72 formed in the P-type injection layer 71 and arranged in intervals. There is an area duty ratio between each periodic hole 73. The P-type injection layer 71 comprises a P-type cladding layer 711, a P-type graded-refractive layer 712 and a P-type heavily-doped capping layer 713. The P-type cladding layer 711 is disposed on the P-type optical confinement layer 60, and the P-type graded-refractive layer 712 is disposed on the P-type cladding layer 711, and the P-type heavily-doped capping layer 713 is disposed on the P-type graded-refractive layer 712. The current confinement structure 80 surrounds the photonic crystal region 70 and does not cover entire photonic crystal region 70, and a size of the current confinement structure 80 is in a range from 1 μm to 1000 μm, so as to prevent from blocking the light generated by the emission layer 50. The transparent conductive layer 90 covers the entire photonic crystal region 70, and is disposed on the current confinement structure 80. In this configuration of the transparent conductive layer 90, current can be spread uniformly, and the current confinement structure 80 can confine the current spreading region, and in this way, confine the light emitting area of the present invention. As a result, the light generated by the emission layer 50 can resonate in the photonic crystal region 70, thereby producing a laser beam. Furthermore, with this configuration of the transparent conductive layer 90, the two-dimensional photonic crystal surface-emitting laser with transparent conductive cladding layer of the present invention can emit a laser beam smoothly.

The N-type graded-refractive layer 20 can reduce heterostructural resistance between the substrate 10 and the N-type cladding layer 30, and the P-type graded-refractive layer 712 can reduce heterostructural resistance between the P-type heavily-doped capping layer 713 and the P-type cladding layer 711. With configuration of the N-type optical confinement layer 40 and the P-type optical confinement layer 60, combinations of electrons and holes are confined in the emission layer 50 to improve injection efficiency and combination efficiency of electrons and holes. Furthermore, the two-dimensional photonic crystal surface-emitting laser with transparent conductive cladding layer can comprise a P-type metal electrode 100 and a back electrode 110, the P-type metal electrode 100 is disposed to surround the photonic crystal region 70 and deposited on the transparent conductive layer 90 to serve as positive electrodes. The back electrode 110 is disposed under the substrate 10 to serve as a negative electrode, to facilitate to apply current to the two-dimensional photonic crystal surface-emitting laser with transparent conductive cladding layer of the present invention. It is preferred that the material of the P-type metal electrode 100 and the back electrode 110 comprise indium (In), tin (Sn), aluminum (Al), gold (Au), platinum (Pt), zinc (Zn), germanium (Ge), silver (Ag), lead (Pb), palladium (Pd), copper (Cu), AuBe, BeGe, nickel (Ni), PbSn, chromium (Cr), AuZn, titanium (Ti), tungsten (W), TiW, or any combination thereof.

The material of the transparent conductive layer 90 can comprise ITO, ZnO, AlGaInSnO, AZO, $SnO_2$, $In_2O_3$, SnZnO, or graphene, and each of these materials has good light transmission rate in visible light wavelength band and infrared light wavelength band for facilitating laser beam emission. Furthermore, a preferred thickness of the transparent conductive layer 90 is in a range from 250 nm to 400 nm. The material of the current confinement structure 80 can comprise single layer or multiple layers made of $Al_2O_3$, $SiO_2$, $SiN_x$, $TiO_2$, $Ta_2O_5$, and $HfO_2$, and aforementioned materials are insulation materials for facilitating confinement of the current in the photonic crystal region 70 without allowing current flow to other regions.

Furthermore, the substrate 10 can be one of silicon substrate, GaAs substrate, a glass substrate, quartz substrate, GaP substrate, GaAsP substrate, AlGaAs substrate, ZnO substrate, sapphire substrate, InP substrate and SiC substrate. Each of the N-type cladding layer 30, the N-type optical confinement layer 40, the emission layer 50, the P-type optical confinement layer 60, and the P-type cladding layer 711 can be selected from the group consisting of GaAs, InGaAs, InGaAsP, AlAs, AlGaInAs, AlGaInP, AlGaAs, InGaNAs, GaAsSb, GaSb, InP, InAs, GaP, AlP, GaN, AlGaN, InGaN, and AlInGaN. By selecting the appropriate materials of the N-type cladding layer 30, the N-type optical confinement layer 40, the emission layer 50, the P-type optical confinement layer 60, P-type cladding layer 711 and the substrate 10, the lattice matching rate can be improved to reduce occurrence of lattice dislocation.

Figure 3:
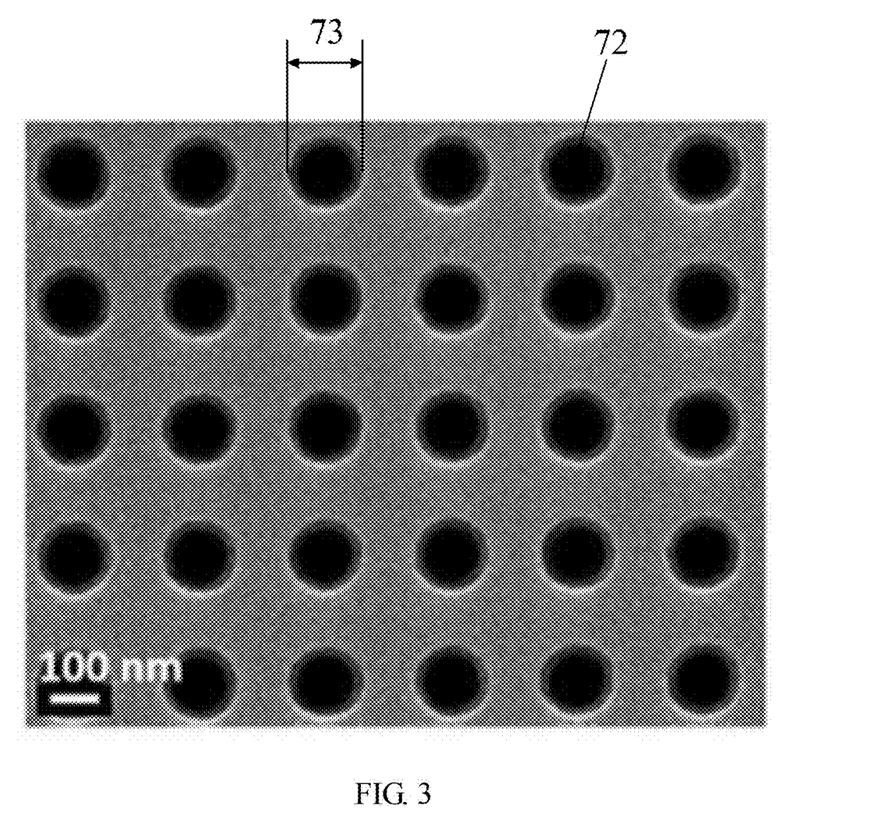
FIG. 3 shows configuration of top-view periodic hole of a two-dimensional photonic crystal surface-emitting laser with transparent conductive cladding layer of a first embodiment of the present invention.

As shown in FIG. 3, a configuration of a top-view periodic hole of a two-dimensional photonic crystal surface-emitting laser with transparent conductive cladding layer of the first embodiment of the present invention. As shown in FIG. 3, in order to make each periodic hole 72 have a complete shape, the periodic hole 72 can be formed by using the inductively coupled plasma reactive ion etching technology and the electron beam lithography technology. In detail, the electron beam lithography can be used to define the shape of each periodic hole 72 to be etched, and the shape of the hole 72 can be changed upon the design requirements, and therefore is not limited to the shape of a circle. Next, the inductively coupled plasma reactive ion etching technology is used to deepen each periodic hole 72; as a result, the etched periodic holes 72 are very clean without remaining etching residue and suited to be a part of the photonic crystal region 70.

Figure 4:
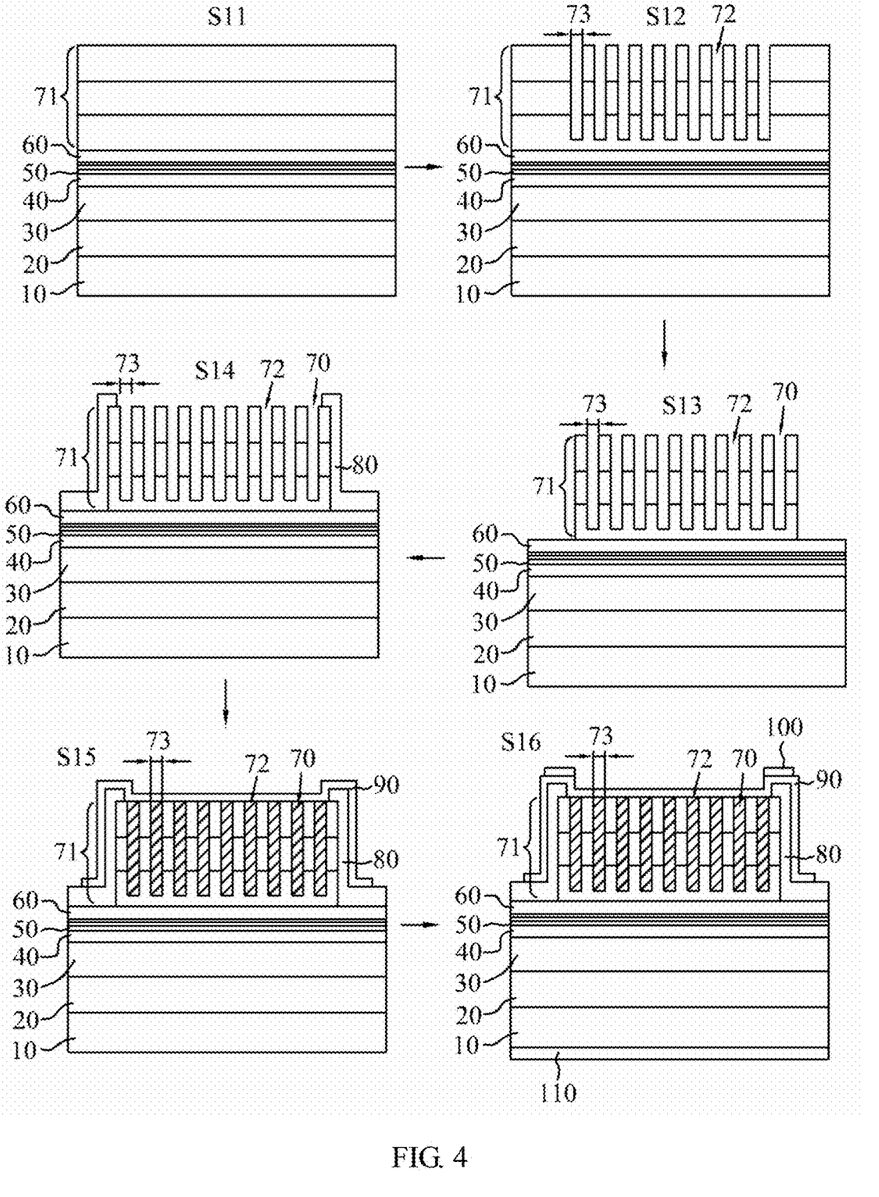
FIG. 4 is a flow chart of manufacturing a two-dimensional photonic crystal surface-emitting laser with transparent conductive cladding layer of a first embodiment of the present invention.

Please refer to FIG. 4, which is a flow chart of manufacturing a two-dimensional photonic crystal surface-emitting laser with transparent conductive cladding layer of a first embodiment of the present invention. The steps of the manufacturing process are described with reference to FIG. 4. In step S11, the N-type graded-refractive layer 20, the N-type cladding layer 30, the N-type optical confinement layer 40, the emission layer 50, the P-type optical confinement layer 60, the P-type cladding layer 711, the P-type graded-refractive layer 712 and the P-type heavily-doped capping layer 713 are disposed on the substrate 10 in a sequential order, from bottom to top. The P-type cladding layer 711, the P-type graded-refractive layer 712 and the P-type heavily-doped capping layer 713 are formed to P-type injection layer 71. In step S12, the inductively coupled plasma reactive ion etching technology and masks are used to etch the P-type cladding layer 711, the P-type graded-refractive layer 712, and the P-type heavily-doped capping layer 713 to form the plurality of periodic holes 72 arranged upon the area duty cycle 73 on the photonic crystal region 70. The photonic crystal region 70 is in a two-dimensional photonic crystal structure and served as a resonator of two-dimensional photonic crystal surface-emitting laser with transparent conductive cladding layer of the present invention, preventing the problem of mode competition. It is preferred that the width of each hole 72 and the duty cycle of each area duty ratio 73 is in a range from 100 nm to 1000 nm, the cross-sectional shape of the periodic hole 72 can be a circular shape, a quadrangular shape or a hexagonal shape. The depth of the periodic hole 72 is in a range from 100 nm to 200 nm. Furthermore, the width and the duty cycle of the area duty ratio 73, and the depth and the shape of the periodic hole 72 can be adjusted according to design requirement in the laser wavelength and the resonator. In step S13, the structure formed in step S11 can be etched to form a platform structure by using wet etching and forming the mesa structure of the photonic crystal region 70. In step S14, the current confinement structure 80 is deposited around the photonic crystal region 70, surrounding the entire photonic crystal region 70. In step S15, the transparent conductive layer 90 is deposited on the current confinement structure 80 to cover the entire photonic crystal region 70, thereby spreading the current uniformly and reducing occurrence of the current crowding effect. With the configuration of current confinement structure 80, the current is confined in the photonic crystal region 70, so that the light emitted from the emission layer 50 can resonate in the photonic crystal region 70. In step S16, the back electrode 110 is disposed under the substrate 10, and the P-type metal electrode 100 is disposed to surround the photonic crystal region 70. And the P-type metal electrode 100 is disposed on the transparent conductive layer 90, allowing the current to be applied to the two-dimensional photonic crystal surface-emitting laser with transparent conductive cladding layer of the present invention easily.

Figure 5:
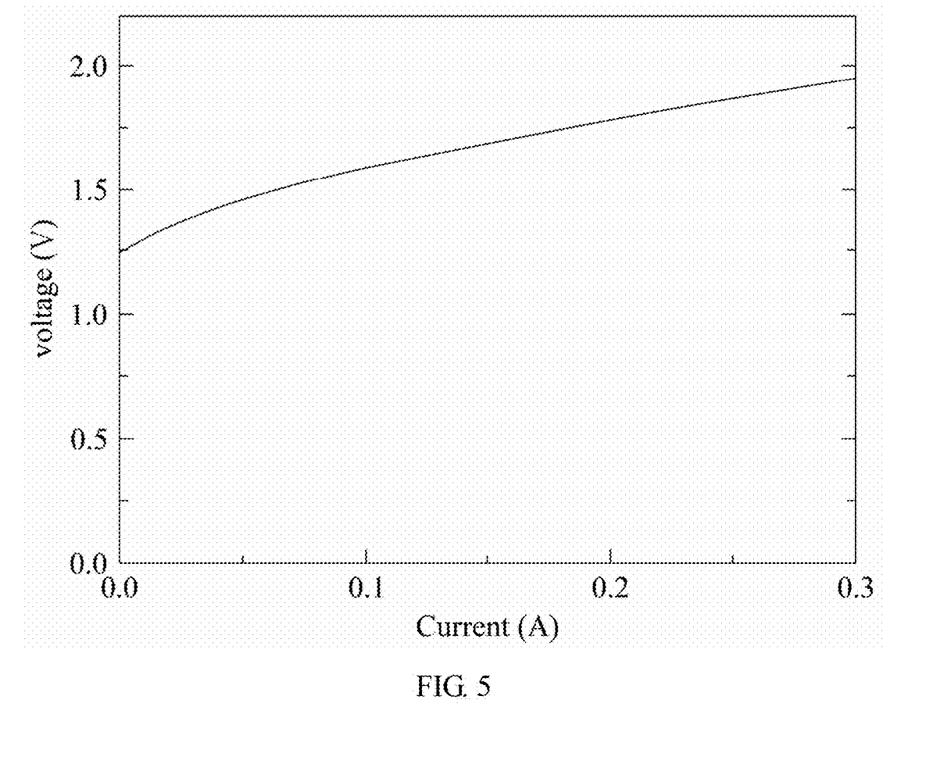
FIG. 5 is an electrical characteristic of current versus voltage performance of a two-dimensional photonic crystal surface-emitting laser with transparent conductive cladding layer of a first embodiment of the present invention.
Figure 6:
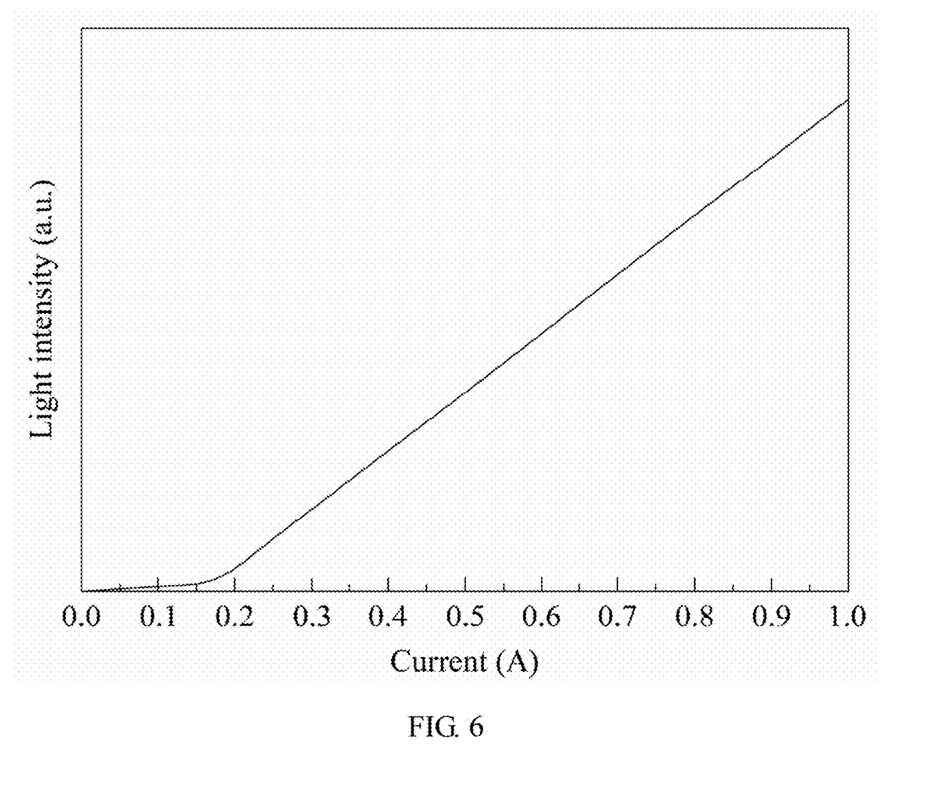
FIG. 6 is a lasing characteristic of current versus output power performance of a two-dimensional photonic crystal surface-emitting laser with transparent conductive cladding layer of a first embodiment of the present invention.
Figure 7:
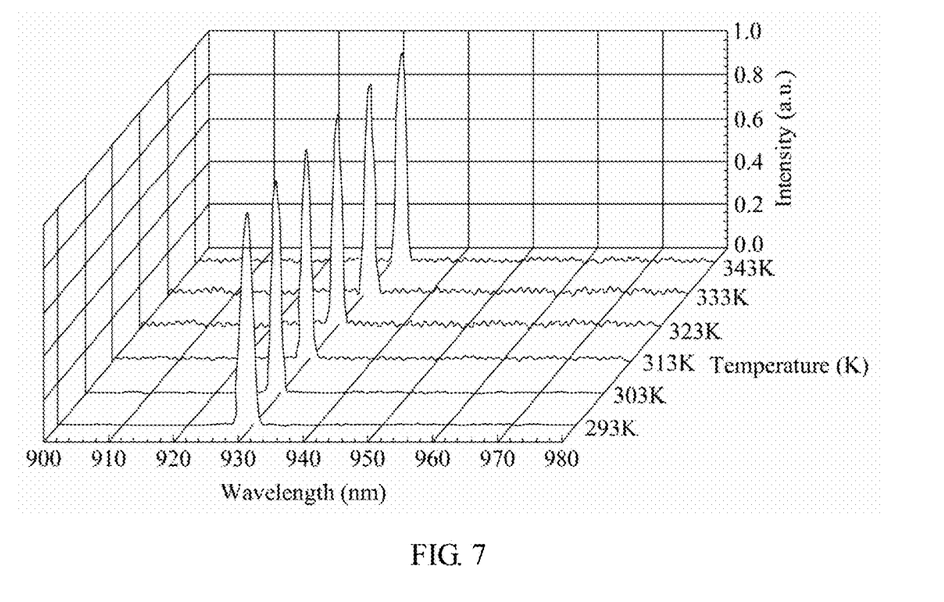
FIG. 7 is a measured spectra at different temperatures from 293K to 343K of a two-dimensional photonic crystal surface-emitting laser with transparent conductive cladding layer of a first embodiment of the present invention.

Please refer to FIGS. 5 to 7, which are respectively an electrical characteristic of current versus voltage performance, a lasing characteristic of current versus output power performance, and a measured spectra at different temperatures from 293K to 343K of the two-dimensional photonic crystal surface-emitting laser with transparent conductive cladding layer of a first embodiment of the present invention, respectively. In an embodiment, the two-dimensional photonic crystal surface-emitting laser with transparent conductive cladding layer formed by the materials with the bandgap at the near-infrared light wavelength band, and the electrical and optical characteristics of the two-dimensional photonic crystal surface-emitting laser of the present invention are illustrated with reference to FIGS. 5 to 7.

As shown in FIGS. 5 and 6, the threshold voltage is 1.25V, the threshold current is in a range from 0.1 A to 0.2 A, the resistance is about 6.4 ohm, so that the two-dimensional photonic crystal surface-emitting laser can be driven to emit laser beam without very high current or voltage. Furthermore, as shown in FIG. 5, the electrical characteristic of voltage versus current is an inclined straight line substantially, indicating that ohm contact is formed in the two-dimensional photonic crystal surface-emitting laser with transparent conductive cladding layer, and the junctions between the layers of the two-dimensional photonic crystal surface-emitting laser with transparent conductive cladding layer of the present invention are very good and bi-directionally conductive. Furthermore, the energy gaps between the layers are not high, so that the electrons and holes are smoothly injected into the emission layer 50 smoothly, thereby improving quantum efficiency by emitting a purer laser beam.

As shown in FIG. 7, the primary wavelengths of laser beams emitted from the two-dimensional photonic crystal surface-emitting laser with transparent conductive cladding layer of the present invention at different temperatures do not shift significantly. The shift amount is about 0.01 nm/K, which is much smaller than the shift amount of the conventional laser using Fabry-Perot resonator, indicating that the two-dimensional photonic crystal surface-emitting laser with transparent conductive cladding layer of the present invention can normally emit laser beam in normal temperature. Furthermore, the transparent conductive layer 90 can decrease the current crowding effect to reduce heat generation, so it is not necessary to limit the two-dimensional photonic crystal surface-emitting laser to be operated in the low-temperature environment for heat-dissipation. The two-dimensional photonic crystal surface-emitting laser of the present invention is still workable at the temperature of 343K. It should also be noted that the full width at half maximum (FWHM) of the laser beam emitted from the two-dimensional photonic crystal surface-emitting laser with transparent conductive cladding layer of the present invention at different temperatures is very narrow.

The light spectrum of the laser beam emitted from the two-dimensional photonic crystal surface-emitting laser with transparent conductive cladding layer of the present invention at different temperatures do not have other defective wavelengths. This indicates that the contact between layers is very good, and a crystal lattice defect or a lattice dislocation does not occur. The divergence angle of the laser beam emitted from the two-dimensional photonic crystal surface-emitting laser with transparent conductive cladding layer of the present invention is smaller than 1 degree, it indicates that the two-dimensional photonic crystal surface-emitting laser with transparent conductive cladding layer of the present invention can emit the laser beam which is centralized and easy to focus without scattering.

Therefore, in the two-dimensional photonic crystal surface-emitting laser with transparent conductive cladding layer of the present invention, the transparent conductive layer 90 can decrease current crowding effect. Current then spreads to other layers uniformly and is confined to the region in the photonic crystal region 70 by the current confinement structure 80, and the light emitted from the emission layer 50 can resonate in the photonic crystal region 70 to produce the laser beam. Furthermore, the two-dimensional photonic crystal surface-emitting laser with transparent conductive cladding layer of the present invention has good electric characteristics due to ohm contacts in the junctions between the layers, and can emit laser beam at normal temperature. The two-dimensional photonic crystal surface-emitting laser with transparent conductive cladding layer of the present invention has excellent performance in photoelectric characteristics and is suitable as a light source. As a result, the two-dimensional photonic crystal surface-emitting laser of the present invention can have aforementioned advantages, and can be operated at a normal temperature to emit the laser beam.

The present invention disclosed herein has been described by means of specific embodiments. However, numerous modifications, variations and enhancements can be made thereto by those skilled in the art without departing from the spirit and scope of the disclosure set forth in the claims.

What is claimed is:

1. A two-dimensional photonic crystal surface-emitting laser with transparent conductive cladding layer, comprise
   a substrate;
   a N-type graded-refractive layer disposed on the substrate;
   a N-type cladding layer disposed on the N-type graded-refractive layer;
   a N-type optical confinement layer disposed on the N-type cladding layer;
   an emission layer disposed on the N-type optical confinement layer;
   a P-type optical confinement layer disposed on the emission layer;
   a photonic crystal region disposed on the P-type optical confinement layer, and comprising a P-type injection layer, and a plurality of periodic holes formed in the P-type injection layer and arranged in interval and there is an area duty ratio between each of the periodic hole;
   a current confinement structure surrounding the photonic crystal region; and
   a transparent conductive layer disposed on the current confinement structure and covering the photonic crystal region.

2. The two-dimensional photonic crystal surface-emitting laser with transparent conductive cladding layer according to claim 1, wherein the photonic crystal region is a two-dimensional periodic structure.

3. The two-dimensional photonic crystal surface-emitting laser with transparent conductive cladding layer according to claim 1, wherein the P-type injection layer comprises a P-type cladding layer, a P-type graded-refractive layer and a P-type heavily-doped capping layer, and the P-type cladding layer is disposed on the P-type optical confinement layer, the P-type graded-refractive layer is disposed on the P-type cladding layer, the P-type heavily-doped capping layer is disposed on the P-type graded-refractive layer.

4. The two-dimensional photonic crystal surface-emitting laser with transparent conductive cladding layer according to claim 1, wherein a width of each of the periodic hole and a duty cycle of the area duty ratio is in a range from 100 nm to 1000 nm.

5. The two-dimensional photonic crystal surface-emitting laser with transparent conductive cladding layer according to claim 1, wherein a cross-sectional shape of each of the plurality of periodic holes is a circular shape, a quadrangular shape or a hexagonal shape.

6. The two-dimensional photonic crystal surface-emitting laser with transparent conductive cladding layer according to claim 1, wherein the emission layer is a multiple-quantum-well structure.

7. The two-dimensional photonic crystal surface-emitting laser with transparent conductive cladding layer according to claim 1, further comprising a P-type metal electrode and a back electrode, wherein the P-type metal electrode is disposed to surround the photonic crystal region, and deposited on the transparent conductive layer, and the back electrode is disposed under the substrate.

8. The two-dimensional photonic crystal surface-emitting laser with transparent conductive cladding layer according to claim 1, wherein a size of the current confinement structure is in a range from 1 μm to 1000 μm.

9. The two-dimensional photonic crystal surface-emitting laser with transparent conductive cladding layer according to claim 1, wherein material of the current confinement structure is insulation material.

10. The two-dimensional photonic crystal surface-emitting laser with transparent conductive cladding layer according to claim 1, wherein material of the transparent conductive layer comprises ITO, ZnO, AlGaInSnO, AZO, $SnO_2$, $In_2O_3$, SnZnO, or graphene.

\* \* \* \* \*